US012720810B2

(12) United States Patent
Lee et al.

(10) Patent No.: US 12,720,810 B2
(45) Date of Patent: Aug. 25, 2026

(54) SEMICONDUCTOR DEVICE AND FORMING METHOD THEREOF

(71) Applicant: Hon Young Semiconductor Corporation, Hsinchu City (TW)

(72) Inventors: Yu-Tsu Lee, Hsinchu City (TW); Yan-Ru Chen, Hsinchu City (TW); Kuang-Hao Chiang, Hsinchu City (TW)

(73) Assignee: Hon Young Semiconductor Corporation, Hsinchu City (TW)

( * ) Notice: Subject to any disclaimer, the term of this patent is extended or adjusted under 35 U.S.C. 154(b) by 688 days.

(21) Appl. No.: 18/170,556

(22) Filed: Feb. 17, 2023

(65) Prior Publication Data

US 2024/0194790 A1 Jun. 13, 2024

(30) Foreign Application Priority Data

Dec. 9, 2022 (TW) .................................. 111147494

(51) Int. Cl.

| | |
|---|---|
| ***H10D 30/67*** | (2025.01) |
| ***H10D 30/01*** | (2025.01) |
| ***H10D 62/13*** | (2025.01) |

(52) U.S. Cl.

CPC ....... *H10D 30/6755* (2025.01); *H10D 30/031* (2025.01); *H10D 30/673* (2025.01); *H10D 62/151* (2025.01)

(58) Field of Classification Search

CPC ............. H10D 30/6755; H10D 30/031; H10D 30/673; H10D 30/668; H10D 62/8325; H10D 62/165; H10D 62/151; H10D 62/052; H10D 62/10; H10D 62/104; H10D 62/105; H10D 62/107; H10D 62/117; H10D 62/124; H10D 62/149; H10D 62/213; H10D 62/221; H10D 64/015; H10D 64/018;

(Continued)

(56) References Cited

U.S. PATENT DOCUMENTS

| | | | | |
|---|---|---|---|---|
| 6,369,421 B1 * | 4/2002 | Xiang | .................... | H10B 41/60 257/411 |
| 6,825,105 B2 * | 11/2004 | Grover | ................. | H10D 30/668 257/E21.384 |

(Continued)

FOREIGN PATENT DOCUMENTS

| | | |
|---|---|---|
| CN | 102576726 B | 1/2015 |
| JP | 6637629 B2 | 1/2020 |
| TW | 201104865 A | 2/2011 |

*Primary Examiner* — Natalia A Gondarenko
(74) *Attorney, Agent, or Firm* — CKC & Partners Co., LLC

(57) ABSTRACT

The present disclosure provides a semiconductor device including a drift layer above the substrate, a source/drain region above the drift layer, an oxide thin film on the source/drain region, a contact on the oxide thin film, and a gate structure adjacent to source/drain region. The oxide thin film directly contacts the top surface of the source/drain region and the bottom surface of the contact. The source/drain region includes a first doping region having a first conductive type and a second doping region having a second conductive type different from the first conductive type, in which the first doping region and the second doping region forms the top surface of the source/drain region. The conduction band energy level of the oxide thin film is lower than the conduction band energy level of the first doping region.

15 Claims, 12 Drawing Sheets

(58) Field of Classification Search
CPC .... H10D 64/027; H10D 64/035; H10D 64/20; H10D 64/23; H10D 64/251; H10D 64/2523; H10D 64/2565; H10D 64/258; H10D 64/311; H10D 30/0291; H10D 30/0293; H10D 30/0297; H10D 30/0312; H10D 30/0616; H10D 30/025; H10D 30/63; H10D 30/66; H10D 48/031; H10D 62/235; H10D 62/292; H10D 62/351; H10D 62/357; H10D 62/364; H10D 62/393; H10D 62/8303; H10D 64/411; H10D 64/511; H10D 64/512; H10D 64/513; H10D 64/514; H10D 64/517; H10D 64/519; H10D 64/605; H10D 64/62; H10D 64/66; H10D 64/661; H10D 64/675; H10D 30/658; H10D 30/6727; H10D 30/693; H10D 30/694; H10D 30/699; H10D 30/794; H10D 12/411–491; H10D 12/01; H10D 12/031–038; H10D 30/0281–0289; H10D 30/0267; H10D 30/0287; H10D 30/0295; H10D 30/601–608; H10D 30/65–659; H10D 30/603; H10D 62/141–148; H10D 62/127; H10D 62/152–155; H10D 62/156–159; H10D 84/40–409; H01L 21/02244; H01L 21/0332; H01L 21/28518; H01L 21/32053
USPC ........ 257/288, 139, 140, 335, 337, 324, 343
See application file for complete search history.

(56) References Cited

U.S. PATENT DOCUMENTS

| | | | | |
|---|---|---|---|---|
| 8,188,480 | B2 | 5/2012 | Itai | |
| 2012/0056202 | A1* | 3/2012 | Wada .................. | H10D 12/031<br>257/77 |
| 2016/0241232 | A1* | 8/2016 | Alexander ........... | H10D 62/115 |
| 2018/0175149 | A1* | 6/2018 | Takaya ................. | H10D 12/031 |
| 2018/0175150 | A1* | 6/2018 | Mauder ................ | H10D 12/481 |
| 2022/0138544 | A1* | 5/2022 | Pesic ...................... | G06N 3/065<br>706/33 |

* cited by examiner 40
115
110
100
160
140
144
142
146
150
154
152
130
136
132
134
124
122
126
120

SEMICONDUCTOR DEVICE AND FORMING METHOD THEREOF

CROSS-REFERENCE TO RELATED APPLICATION

This application claims priority to Taiwan Application Serial Number 111147494, filed Dec. 9, 2022, which is herein incorporated by reference in its entirety.

BACKGROUND

Field of Invention

The present disclosure relates to the semiconductor device and the forming method thereof. More particularly, the present disclosure relates to the metal oxide semiconductor device and the forming method thereof.

Description of Related Art

In a semiconductor device, the ohmic contact resistance appears between the metal contact and the semiconductor material. When the ohmic contact resistance is large, the ON resistance ($R_{on}$) of the semiconductor device may increase and affect the device performance. If the semiconductor material is doped, the barrier thickness between the metal contact and the semiconductor material may be reduced to decrease the ohmic contact resistance. However, it becomes difficult to increase the doping concentration of the semiconductor material due to the high ionization energy. This limits the reduction of the ohmic contact resistance by doping the semiconductor material. Therefore, this challenge needs to be overcome for improving the performance of the semiconductor device to keep up with the development of semiconductor field.

SUMMARY

According to one embodiment of the present disclosure, a semiconductor device includes a drift layer above the substrate, a source/drain region above the drift layer, and oxide thin film on the source/drain region, a contact on the oxide thin film, and a gate structure adjacent to the source/drain region. The source/drain region includes a first doping region doped having a first conductive type and a second doping region having a second conductive type. The first doping region and the second doping region form a top surface of the source/drain region. The second conductive type is different from the first conductive type. The oxide thin film directly contacts the top surface of the source/drain region. A conduction band energy level of the oxide thin film is lower than a conduction band energy level of the first doping region. The oxide thin film directly contacts a bottom surface of the contact.

In some embodiments, a thickness of the oxide thin film is between 1 nm and 5 nm.

In some embodiments, when the first conductive type is p-type, the conduction band energy level of the oxide thin film is lower than a valance band energy level of the first doping region. An energy gap between the conduction band energy level of the oxide thin film and the valance band energy level of the first doping region is larger than or equal to 0.1 eV.

In some embodiments, the oxide thin film includes $MoO_3$, $WO_3$, or $V_2O_5$.

In some embodiments, the contact includes a metal material having a work function between 4.6 eV and 7.0 eV.

In some embodiments, when the first conductive type is n-type, an energy gap between the conduction band energy level of the oxide thin film and the conduction band energy level of the first doping region is smaller than or equal to 0.1 eV.

In some embodiments, the oxide thin film includes $TiO_2$.

In some embodiments, the contact includes a metal material having a work function between 2.0 eV and 4.4 eV.

In some embodiments, the oxide thin film covers the first doping region and the second doping region, and the contact covers the oxide thin film.

In some embodiments, the oxide thin film covers the first doping region, and the contact covers the oxide thin film and the second doping region.

In some embodiments, the oxide thin film includes a first film portion covering the first doping region and a second film portion covering the second doping region. A material of the first film portion is different from that of the second film portion.

In some embodiments, the source/drain region further includes a third doping region having the second conductive type. The first doping region is sandwiched between the second doping region and the third doping region. The first doping region, the second doping region, and the third doping region form the top surface of the source/drain region.

In some embodiments, the oxide thin film includes a first film portion covering the first doping region, a second film portion covering the second doping region and a third film portion covering the third doping region. A material of the first film portion is different from that of the second film portion and the third film portion.

In some embodiments, the gate structure includes a gate electrode layer extending from the source/drain region into the drift layer and a gate dielectric layer surrounding the gate electrode layer. The gate dielectric layer isolates the gate electrode layer from the source/drain region and isolates the gate electrode layer from the drift layer.

In some embodiments, the gate dielectric layer extends onto the source/drain region, and the gate dielectric layer directly contacts the top surface of the source/drain region.

In some embodiments, the oxide thin film and the gate dielectric layer are laterally spaced by a distance.

In some embodiments, the oxide thin film directly contacts the gate dielectric layer.

According to some embodiments of the present disclosure, a method of forming a semiconductor device includes the following step. A drift layer is formed above the substrate. A top surface of the drift layer is doped with a first conductive type dopant to form a first doping region of a source/drain region. The top surface of the drift layer is doped with a second conductive type dopant different from the first conductive type dopant to form a second doping region of the source/drain region. An oxide thin film is formed on the source/drain region, in which the oxide thin film directly contacts a top surface of the source/drain region. A conduction band energy level of the oxide thin film is lower than a conduction band energy level of the first doping region. A contact is formed on the oxide thin film, in which a bottom surface of the contact directly contacts the oxide thin film.

In some embodiments, the drift layer is doped with the first conductive type dopant to a doping concentration between $5\times10^{18}/cm^3$ and $5\times10^{20}/cm^3$.

In some embodiments, the method further includes forming an opening in the drift layer and a protruding portion along the opening before doping the drift layer. The protruding portion of the drift layer is doped with the first conductive type dopant and the second conductive type dopant to form the source/drain region. After doping the drift layer, a gate structure is formed in the opening, in which the gate structure extends from the source/drain region into the drift layer.

According to the above-mentioned embodiments, the oxide thin film in the semiconductor device of the present disclosure has the conduction band energy level lower than the conduction band energy level of the doping region in the source/drain region. Therefore, the oxide thin film can change the energy level of the source/drain region, which reduces the resistance of the semiconductor device and improve the device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
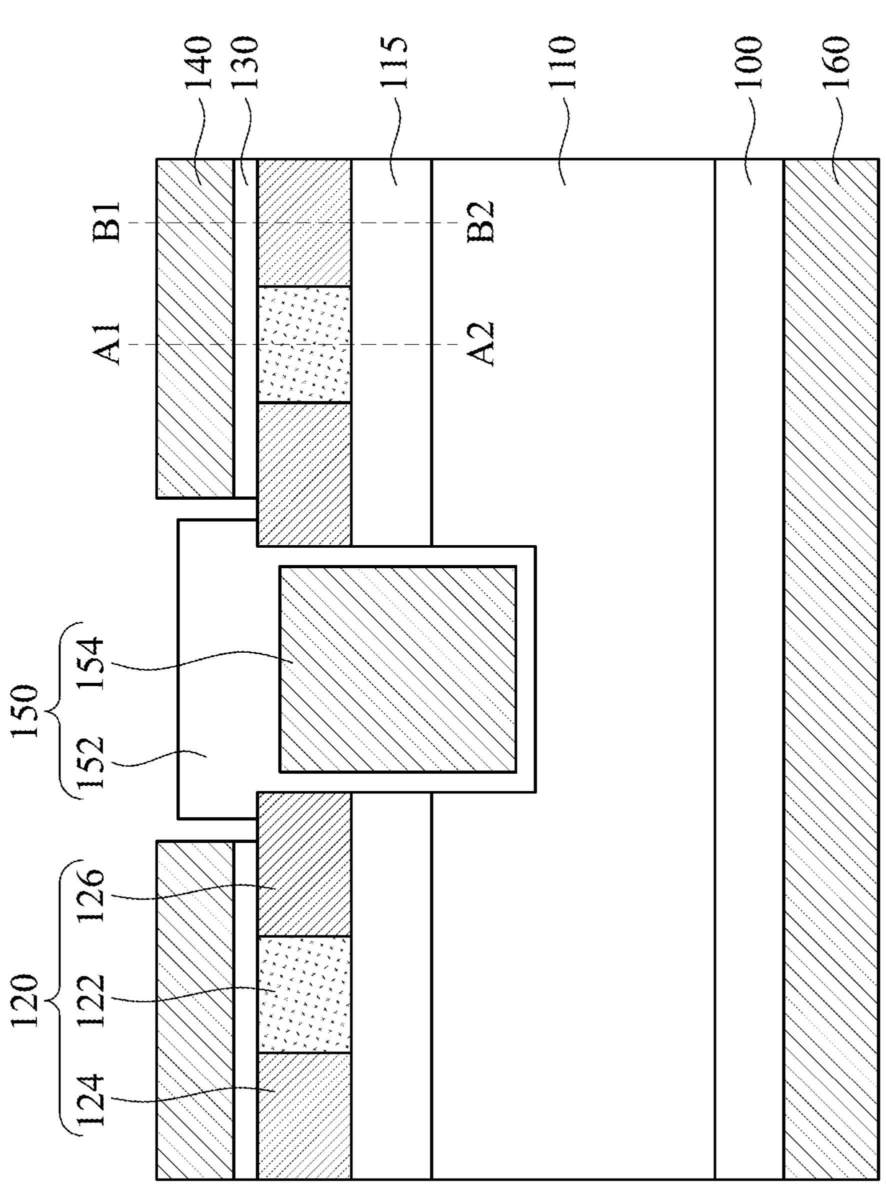
FIG. 1 illustrates a cross-sectional view of a semiconductor device according to one embodiment of the present disclosure.

The following disclosure provides many different embodiments, or examples, for implementing different features of the provided subject matter. Specific examples of components, materials, arrangements, etc., are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a semiconductor device and the forming method thereof. The semiconductor device includes a source/drain region with doping regions, a contact, and an oxide thin film between the source/drain region and the contact. Since the oxide thin film and the doping region of the source/drain region have a suitable energy level comparison, the oxide thin film may enhance the tunneling effect between the source/drain region and the contact. Therefore, the contact resistance between the source/drain region and the contact is reduced to improve the performance of the semiconductor device.

According to one embodiment of the present disclosure, FIG. 1 illustrates a cross-sectional view of a semiconductor device 10. The semiconductor device 10 includes a substrate 100, a drift layer 110 above the substrate 100, a source/drain region 120 above the drift layer 110, an oxide thin film 130 on the source/drain region 120, a contact 140 on the oxide thin film 130, and a gate structure 150 adjacent to the source/drain region 120. The bottom surface of the oxide thin film 130 directly contacts the top surface of the source/drain region 120, and the top surface of the oxide thin film 130 directly contacts the bottom surface of the contact 140. The oxide thin film 130 may change the energy level of the source/drain region 120, so that the contact resistance between the source/drain region 120 and the contact 140 is reduced. This decrease the overall ON resistance ($R_{on}$) in the semiconductor device.

Specifically, the substrate 100, the drift layer 110, and the source/drain region 120 form a semiconductor material stack, in which various regions in the semiconductor material stack are doped with different type of dopants. The substrate 100 may include elementary semiconductor material, compound semiconductor material, or other materials suitable for the base of the semiconductor material stack, such as silicon (Si), silicon carbide (SiC), silicon germanium (SiGe), or the like. The drift layer 110 may include a base material same as or different from that of the substrate 100. In the embodiments which the substrate 100 is a silicon substrate, the drift layer 110 may be a silicon layer or a silicon carbide layer doped with nitrogen (N), phosphorus (P), arsenic (As), or other n-type dopants. The source/drain region 120 may include a base material same as that of the drift layer 110. In the embodiments which the drift layer 110 is a silicon carbide layer, the source/drain region 120 may be a silicon carbide layer doped with n-type dopants and p-type dopants, such as boron (B), gallium (Ga), or the like. In some embodiments, the drift layer 110 may be doped with p-type dopants, while the source/drain region 120 is doped with n-type dopants and p-type dopants.

The source/drain region 120 is doped with dopants to form a plurality of doping regions. More specifically, the source/drain region 120 includes a first doping region 122, a second doping region 124, and a third doping region 126 at the top portion of the source/drain region 120. The top surfaces of the first doping region 122, the second doping region 124, and the third doping region 126 may be coplanar, so that the first doping region 122, second doping region 124, and the third doping region 126 collectively form the top surface of the source/drain region 120. The first doping region 122 is disposed between the second doping region 124 and the third doping region 126. Particularly, the first doping region 122 is sandwiched between the second doping region 124 and the third doping region 126. The third doping region 126 is closer to the gate structure 150 than the first doping region 122.

The first doping region 122 has a first conductive type, while the second doping region 124 and the third doping region 126 have a second conductive type different from the first conductive type. For example, the first doping region 122 may be doped with the p-type dopants, and the second doping region 124 and the third doping region 126 are doped with the n-type dopants. The doping concentrations of the first doping region 122, the second doping region 124, and the third doping region 126 are higher than that of the drift layer 110 to form the source/drain region 120 other than the drift layer 110. In some other embodiments, the first doping region 122 may be doped with the n-type dopants, and the second doping region 124 and the third doping region 126 may be doped with the p-type dopants. In the embodiment shown in FIG. 1, the source/drain region 120 is illustrated as three doping regions to depict the various dopants included in the source/drain region 120. However, the source/drain region 120 in other embodiments may include less than or more than three doping regions, which is not intended to be limiting.

The contact 140 is above and electrically connected to the source/drain region 120. The contact 140, the source/drain region 120, the drift layer 110, and the substrate 100 may form a conductive path through the semiconductor device 10 under the control of the gate structure 150. In some embodiments, the semiconductor device 10 may also include a contact 160 below the substrate 100, in which the contact 140 and the contact 160 are respectively referred as the source contact and the drain contact of the semiconductor device 10. In some embodiments, a well 115 may be disposed between the drift layer 110 and the source/drain region 120. The well 115 may include the base material of the drift layer 110 and has a conductive type different from the drift layer 110. For example, in the embodiments which the drift layer 110 is doped with the n-type dopants, the well 115 may be doped with the p-type dopants to form a p-type well.

The oxide thin film 130 is disposed between the source/drain region 120 and the contact 140. Particularly, the bottom surface of the oxide thin film 130 directly contacts the top surface of the source/drain region 120, so that the oxide thin film 130 covers at least a portion of the source/drain region 120. The bottom surface of the contact 140 directly contacts the top surface of the oxide thin film 130, so that the contact 140 covers at least a portion of the oxide thin film 130. Along the conductive path direction from the contact 140 to the source/drain region 120, the portion of the oxide thin film 130 covered by the contact 140 and the portion of the oxide thin film 130 covering the source/drain region 120 are overlapped. Therefore, the contact 140 is electrically connected to the source/drain region 120 through the oxide thin film 130.

The oxide thin film 130 may change the energy level of the source/drain region 120 to enhance the tunneling of the charge carrier between the source/drain region 120 and the contact 140. Specifically, the conduction band energy level of the oxide thin film 130 is lower than the conduction band energy level of the source/drain region 120 to bend the energy level of the source/drain region 120. As a result, the oxide thin film 130 reduces the contact resistance between the source/drain region 120 and the contact 140, thereby improving the performance of the semiconductor device 10. In addition, the oxide thin film 130 may provide the interface passivation between the source/drain region 120 and the contact 140 to protect the surface of the source/drain region 120.

Figure 2:
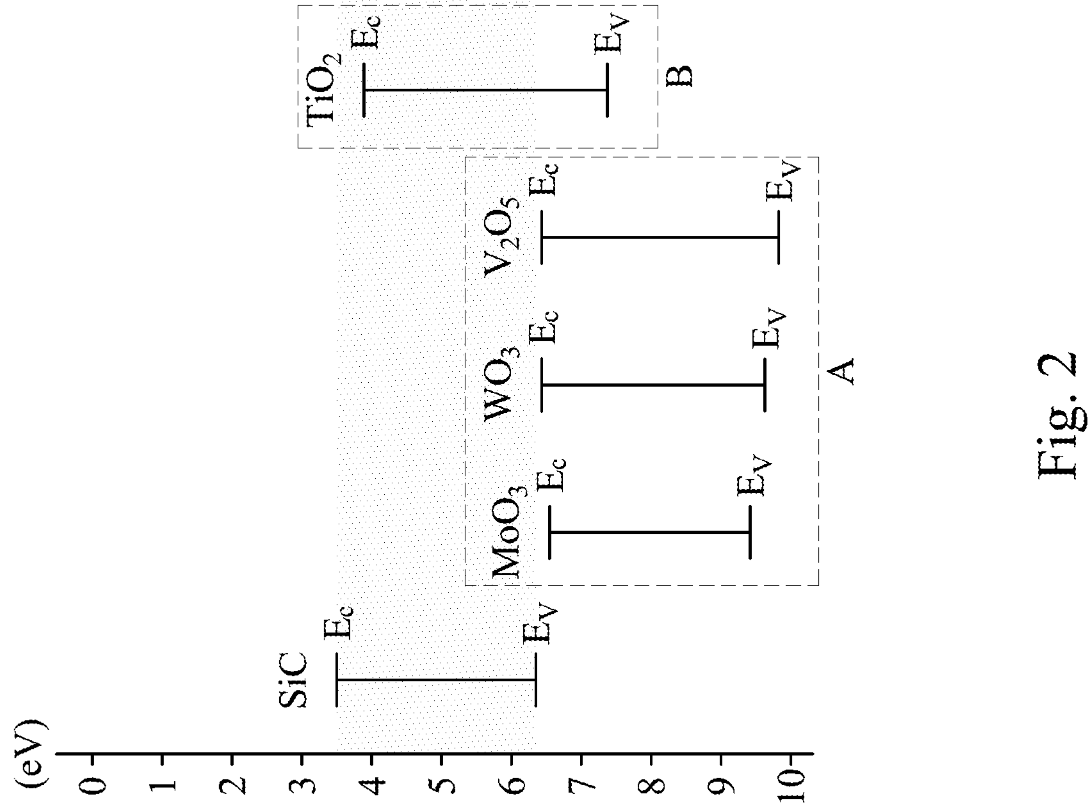
FIG. 2 illustrates an energy level diagram of the material of the source/drain region and the materials of the oxide thin film according to some embodiments of the present disclosure.

To clearly depict the energy level relation between the source/drain region 120 and the oxide thin film 130, FIG. 2 illustrates an energy level diagram of the source/drain region 120 and the oxide thin film 130 according to some embodiments of the present disclosure. The vertical axis shown in FIG. 2 illustrates the energy required for escape from the energy level. $E_v$ and $E_c$ respectively represent the valance band energy level and the conduction band energy level of each material. If the energy level corresponds to higher value of the vertical axis, the electron needs higher energy to escape from the energy level, which is referred as a "lower energy level".

In the embodiments shown in FIG. 2, the base material of the source/drain region 120 is silicon carbide. The oxide thin film 130 may include the oxide material of group A or group B according to the dopant type included in the source/drain region 120. The screentone in FIG. 2 shows the energy gap of silicon carbide for clearer comparison between the energy levels of the source/drain region 120 and the oxide thin film 130. It should be noted that the embodiments illustrated in FIG. 2 are merely the material combination examples of the source/drain region 120 and the oxide thin film 130, and that the oxide thin film 130 may include other materials corresponding to the source/drain region 120 in other embodiments of the present disclosure.

In the embodiments which the source/drain region 120 includes the p-type doping region, the conduction band energy level of the oxide thin film 130 is lower than the conduction band energy level of the source/drain region 120, and the conduction band energy level of the oxide thin film 130 is also lower than the valance band energy level of the source/drain region 120. Particularly, the energy gap between the conduction band energy level of the oxide thin film 130 and the valance band energy level of the source/drain region 120 is larger than or equal to 0.1 eV, such as in a range of 0.1 eV to 1.0 eV. If the energy gap is smaller than 0.1 eV, the oxide thin film 130 may not be able to change the energy level of the source/drain region 120 for significantly improving the tunneling effect of the charge carrier. In some other embodiments, the energy gap between the conduction band energy level of the oxide thin film 130 and the valance band energy level of the source/drain region 120 may be larger than 1.0 eV.

As shown in FIG. 2, in the embodiments which the source/drain region 120 includes the p-type doping region, the oxide thin film 130 may include the oxide material of group A. The conduction band energy levels of group A are lower than the valance band energy level of the source/drain region 120, and the energy gap between the conduction band energy level of group A and the valance band energy level of the source/drain region 120 is larger than 0.1 eV. For example, the oxide material of group A may include $MoO_3$, $WO_3$, or $V_2O_5$.

In the embodiments which the source/drain region 120 includes the n-type doping region, the conduction band energy level of the oxide thin film 130 is lower than the conduction band energy level of the source/drain region 120, but the two conduction band energy levels are very close. Particularly, the energy gap between the conduction band energy level of the oxide thin film 130 and the conduction band energy level of the source/drain region 120 is smaller than or equal to 0.1 eV, such as in a range of 0.01 eV to 0.1 eV. If the energy gap is larger than 0.1 eV, the oxide thin film 130 may not be able to change the energy level of the source/drain region 120 for significantly improving the tunneling effect of the charge carrier.

As shown in FIG. 2, in the embodiments which the source/drain region 120 includes the n-type doping region, the oxide thin film 130 may include the oxide material of group B. The conduction band energy level of group B is lower than the conduction band energy level of the source/drain region 120, but the difference is small. For example, the oxide material of group B may include $TiO_2$.

Figure 3:
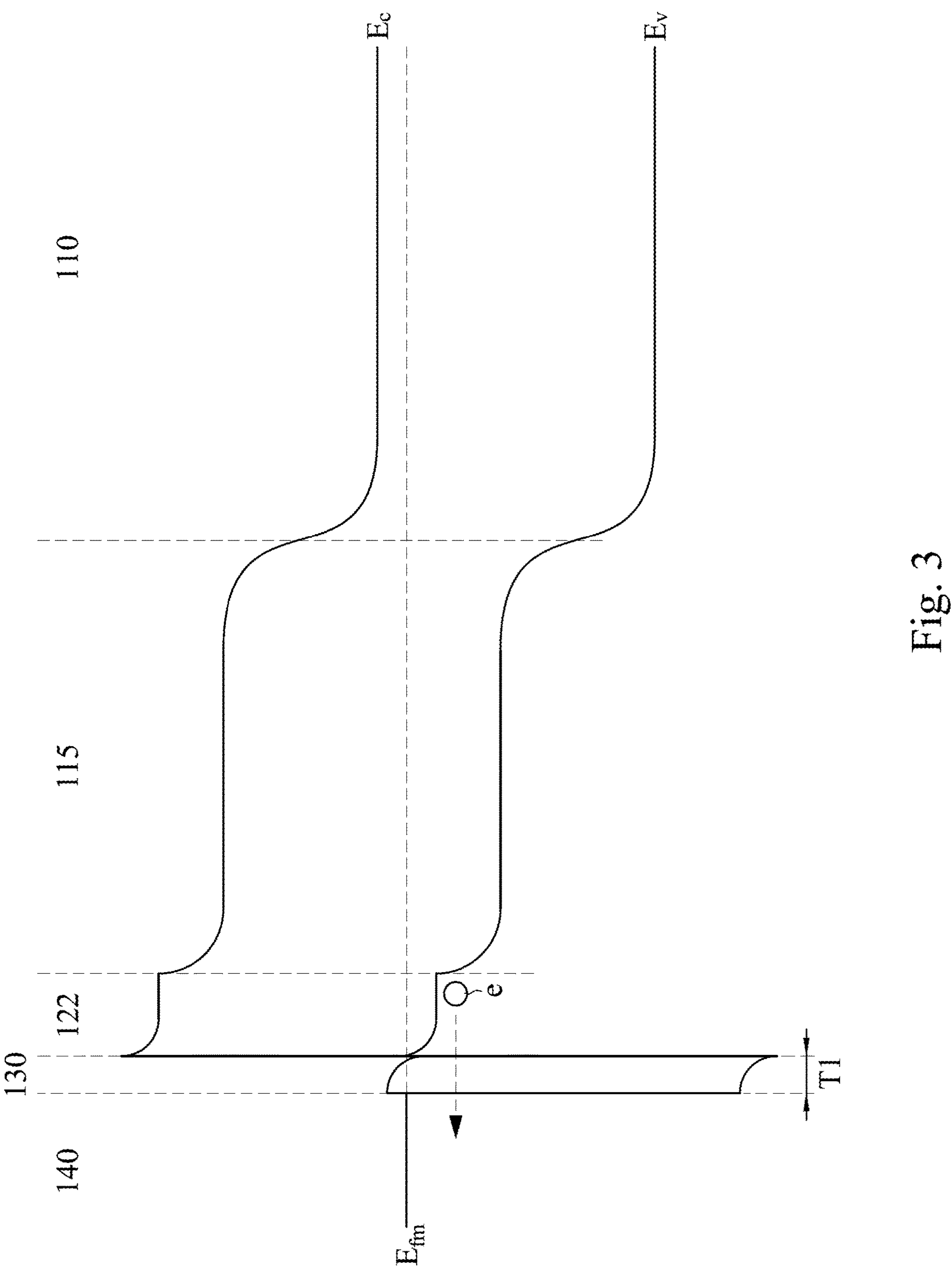
FIG. 3 illustrates an energy level changing diagram in the semiconductor device along the line A1-A2 in FIG. 1 according to some embodiments of the present disclosure.
Figure 4:
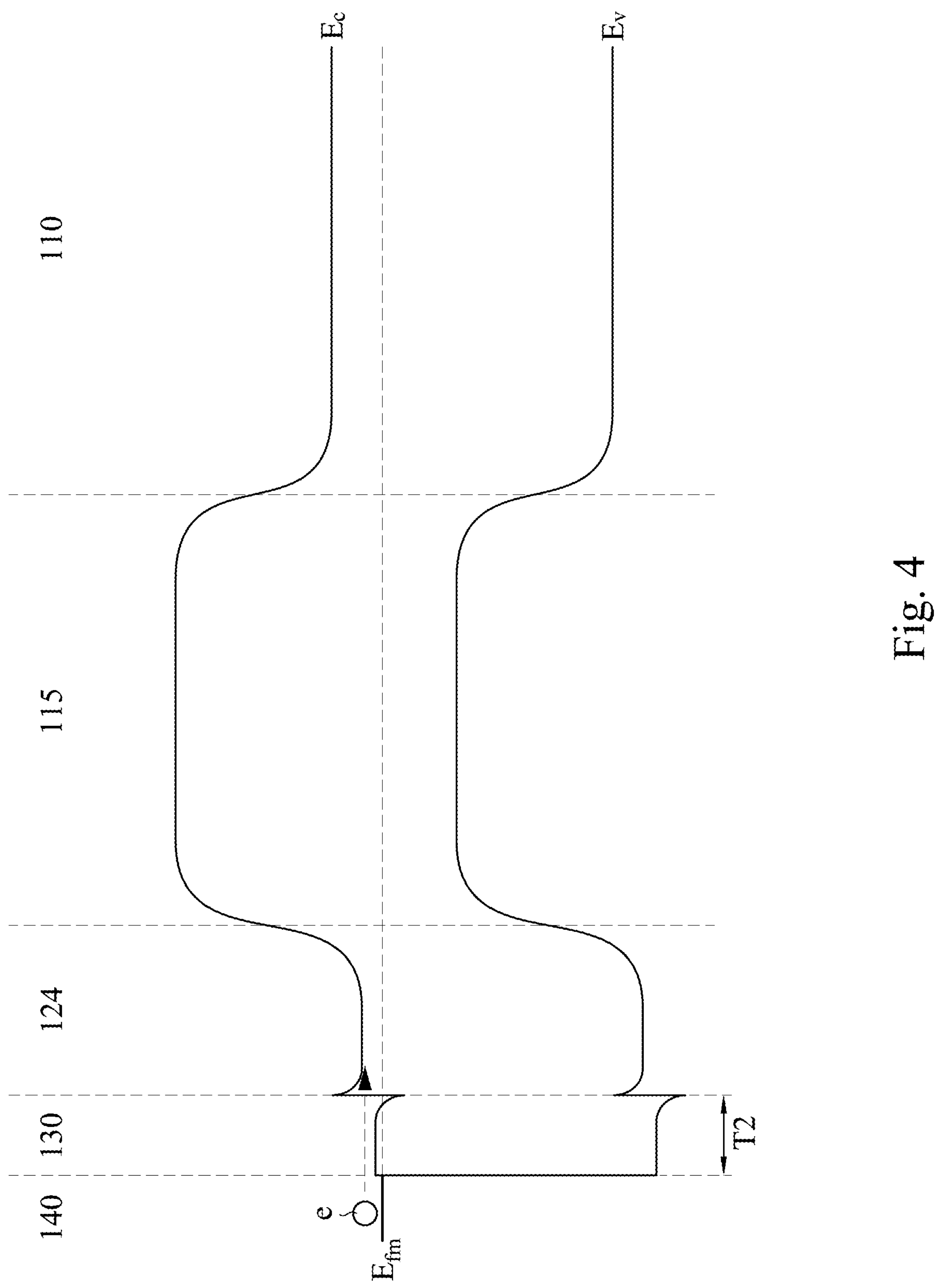
FIG. 4 illustrates an energy level changing diagram in the semiconductor device along the line B1-B2 in FIG. 1 according to some embodiments of the present disclosure.

To clearly depict the energy level of the source/drain region 120 changed by the oxide thin film 130, FIGS. 3 and 4 illustrate the energy level changing diagram of various regions in the semiconductor device according to some embodiments of the present disclosure. In FIGS. 3 and 4, $E_v$ and $E_c$ respectively represent the valance band energy level and the conduction band energy level of the materials, and $E_{fm}$ represents the fermi level of the conductive material of the contact 140.

According to some embodiments of the present disclosure, FIG. 3 illustrates the energy level changing diagram along the line A1-A2 in the semiconductor device 10 of FIG. 1. In the embodiments shown in FIG. 3, the first doping region 122 is a p-type doping region. The conduction band energy level of the oxide thin film 130 is lower than the valance band energy level of the first doping region 122, and the energy gap of those two energy levels is larger than or equal to 0.1 eV. At the interface defined by the oxide thin film 130 and the first doping region 122, the difference between the energy levels of the oxide thin film 130 and the first doping region 122 leads to the bending of the valance band energy level of the first doping region 122, thereby increasing the tunneling possibility of the charge carrier e from the first doping region 122 to the contact 140.

According to some embodiments of the present disclosure, FIG. 4 illustrates the energy level changing diagram along the line B1-B2 in the semiconductor device 10 of FIG. 1. In the embodiments shown in FIG. 4, the second doping region 124 is an n-type doping region. The conduction band energy level of the oxide thin film 130 is lower than the conduction band energy level of the second doping region 124, and the two energy levels are close to each other. At the interface defined by the oxide thin film 130 and the second doping region 124, the difference between the energy levels of the oxide thin film 130 and the second doping region 124 leads to the bending of the conduction band energy level of the second doping region 124, thereby increasing the tunneling possibility of the charge carrier e from the contact 140 to the second doping region 124.

In FIGS. 3 and 4, the thickness T1 and the thickness T2 represent the thickness of the oxide thin film 130. In some embodiments, the thickness of the oxide thin film 130 may be smaller than or equal to 5 nm to provide high tunneling effect. For example, the thickness of the oxide thin film 130 may be between 1 nm and 5 nm. In the embodiments which the source/drain region 120 includes the p-type doping region, if the energy gap between the conduction band energy level of the oxide thin film 130 and the valance band energy level of the source/drain region 120 is larger, the oxide thin film 130 between the source/drain region 120 and the contact 140 may be allowed to have larger thickness. Correspondingly, if the energy gap between the conduction band energy level of the oxide thin film 130 and the valance band energy level of the source/drain region 120 is smaller, the thickness of the oxide thin film 130 needs to be smaller to significantly improve the tunneling effect.

In the embodiments which the source/drain region 120 includes the n-type doping region, if the energy gap between the conduction band energy level of the oxide thin film 130 and the conduction band energy level of the source/drain region 120 is smaller, the oxide thin film 130 between the source/drain region 120 and the contact 140 may be allowed to have larger thickness. Correspondingly, if the energy gap between the conduction band energy level of the oxide thin film 130 and the conduction band energy level of the source/drain region 120 is larger, the thickness of the oxide thin film 130 needs to be smaller to significantly improve the tunneling effect.

In some embodiments, the material of the contact 140 may be selected corresponding to the oxide thin film 130 to further reduce the contact resistance between the contact 140 and the source/drain region 120. In the embodiments which the source/drain region 120 includes the p-type doping region, the contact 140 may include the conductive material having relative high work function, such as the metal material having the work function between about 4.6 eV and about 7.0 eV. For example, the contact 140 may include gold (Au), platinum (Pt), molybdenum (Mo), nickel (Ni), combinations thereof, or the like. In the embodiments which the source/drain region 120 includes the n-type doping region, the contact 140 may include the conductive material having relative low work function, such as the metal material having the work function between about 2.0 eV and about 4.4 eV. For example, the contact 140 may include silver (Ag), aluminum (Al), titanium (Ti), combinations thereof, or the like.

Referring back to FIG. 1, in the embodiment shown in FIG. 1, the bottom surface of the oxide thin film 130 directly contacts the top surfaces of the first doping region 122, the second doping region 124, and the third doping region 126 to cover the first doping region 122, the second doping region 124, and a portion of the third doping region 126. The bottom surface of the contact 140 directly contacts the top surface of the oxide thin film 130 to cover the oxide thin film 130. The sidewall of the contact 140 may be coplanar with that of the oxide thin film 130, so that the contact 140 covers the entire top surface of the oxide thin film 130.

In the embodiment shown in FIG. 1, the source/drain region 120 includes the p-type doping region and the n-type doping region, such as the first doping region 122 and the second doping region 124. If the oxide thin film 130 is not disposed in the semiconductor device 10, the contact resistance between the p-type doping region and the contact 140 may be larger than the contact resistance between the n-type doping region and the contact 140. Therefore, the material of the oxide thin film 130 may be selected corresponding to the p-type doping region to give priority to reducing the contact resistance between the p-type doping region and the contact 140. For example, the oxide material of the oxide thin film 130 may be selected from group A in FIG. 2.

Figure 5:
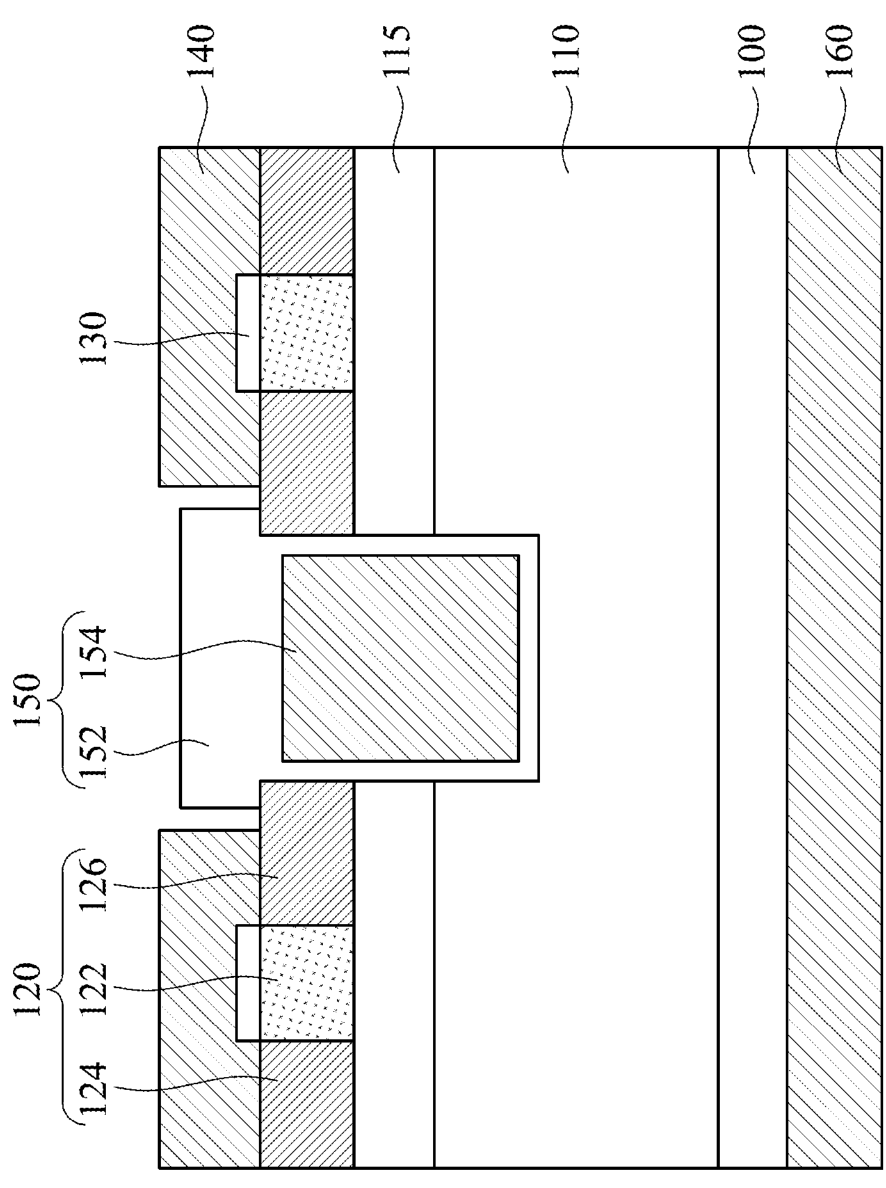
FIG. 5 illustrates a cross-sectional view of a semiconductor device according to another embodiment of the present disclosure.

The semiconductor device structure of the present disclosure is not limited to the embodiment illustrated in FIG. 1. According to another embodiment of the present disclosure, FIG. 5 illustrates a cross-sectional view of the semiconductor device 20. The semiconductor device 20 is similar to the semiconductor device 10 in FIG. 1, except for the structure of the oxide thin film 130. In the semiconductor device 20, the oxide thin film 130 is formed on the first doping region 122 but not on the second doping region 124 and the third doping region 126. In other words, the oxide thin film 130 covers the first doping region 122 without covering the second doping region 124 and the third doping region 126. Since the oxide thin film 130 is not formed between the second doping region 124 and the contact 140, the contact 140 covers the oxide thin film 130 on the first doping region 122 and the second doping region 124. In addition, the oxide thin film 130 is not formed between the third doping region 126 and the contact 140 so the contact 140 covers at least a portion of the third doping region 126.

In the embodiment shown in FIG. 5, the first doping region 122 is a p-type doping region, and the second doping region 124 is an n-type doping region. If the oxide thin film 130 is not disposed, the contact resistance between the first doping region 122 and the contact 140 may be larger than the contact resistance between the second doping region 124 and the contact 140. Therefore, the oxide thin film 130 may be formed mainly on the first doping region 122 and include the material suitable for matching with the p-type doping region to particularly reduce the contact resistance between the first doping region 122 and the contact 140. In other words, the bottom surface of the oxide thin film 130 may directly contact at least the top surface of the first doping region 122.

Figure 6:
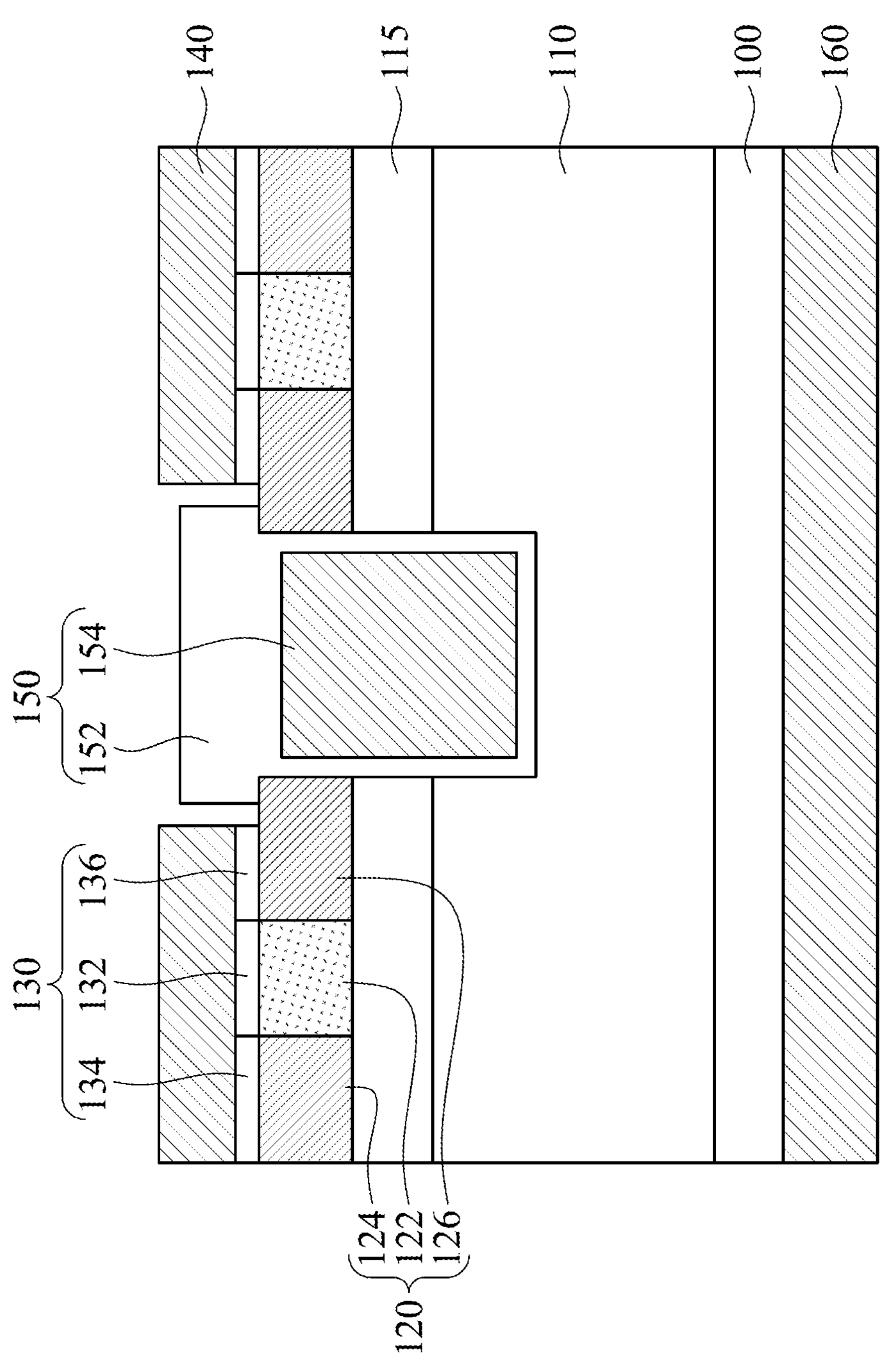
FIG. 6 illustrates a cross-sectional view of a semiconductor device according to another embodiment of the present disclosure.

According to another embodiment of the present disclosure, FIG. 6 illustrates a cross-sectional view of the semiconductor device 30. The semiconductor device 30 is similar to the semiconductor device 10 in FIG. 1, except for the structure of the oxide thin film 130. In the semiconductor device 30, the oxide thin film 130 includes a first film portion 132 covering the first doping region 122, a second film portion 134 covering the second doping region 124, and a third film portion 136 covering a portion of the third doping region 126. The first film portion 132, the second film portion 134, and the third film portion 136 are respectively aligned with the doping regions below, and each film portion includes the oxide material matching with the corresponding doping region.

In the embodiment shown in FIG. 6, the conductive type of the dopant in first doping region 122 is different from that of the dopant in the second doping region 124 and the third doping region 126. In other words, the material of the first film portion 132 may be different from that of the second film portion 134 and the third film portion 136. For example, in the embodiments which the first doping region 122 includes the p-type dopant, and the second doping region 124 and the third doping region 126 includes the same n-type dopant, the conduction band energy level of the first film portion 132 may be lower than the valance band energy level of the first doping region 122. The conduction band energy levels of the second film portion 134 and the third film portion 136 may be lower than but close to the conduction band energy levels of the second doping region 124 and the third doping region 126.

Figure 7:
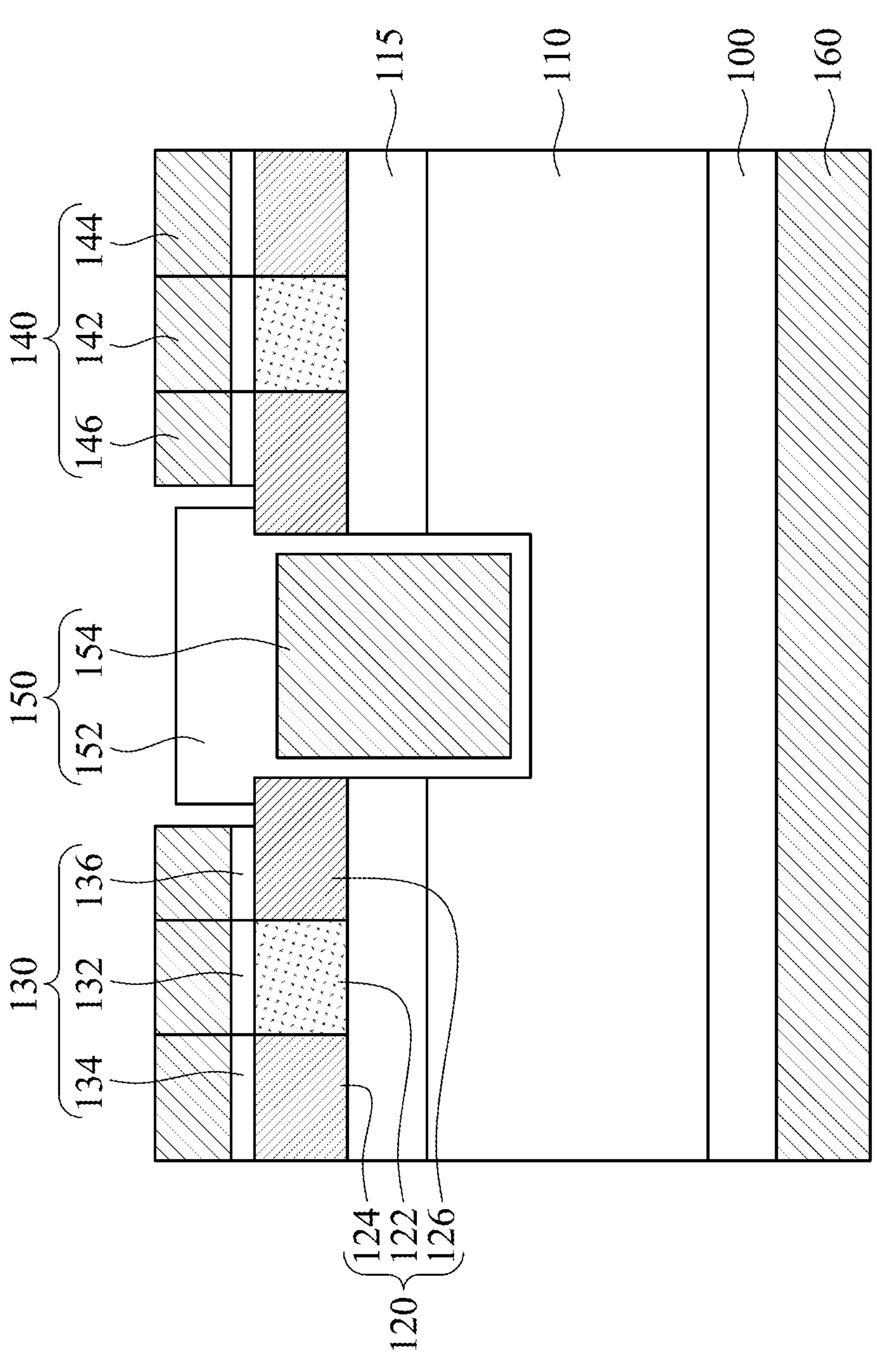
FIG. 7 illustrates a cross-sectional view of a semiconductor device according to another embodiment of the present disclosure.

In the embodiments which the oxide thin film 130 includes a plurality of film portions, the contact 140 may include a plurality of contact portions to match with the film portions. According to another embodiment of the present disclosure, FIG. 7 illustrates a cross-sectional view of the semiconductor device 40. The semiconductor device 40 is similar to the semiconductor device 30 in FIG. 6, except for the structure of the contact 140. The contact 140 includes a first contact portion 142 covering the first film portion 132, a second contact portion 144 covering the second film portion 134, and a third contact portion 146 covering the third film portion 136. The first contact portion 142, the second contact portion 144, and the third contact portion 146 are respectively aligned with the film portions below, and each contact portion includes the conductive material matching with the corresponding film portion.

In the embodiments which the conductive type of the first doping region 122 is different from that of the second doping region 124 and the third doping region 126, the material of the first film portion 132 may be different from that of the second film portion 134 and the third film portion 136. Correspondingly, the material of the first contact portion 142 may be different from that of the second contact portion 144 and the third contact portion 146. For example, in the embodiments which the conduction band energy level of the first film portion 132 is lower than the valance band energy level of the first doping region 122, and the conduction band energy levels of the second film portion 134 and the third film portion 136 are lower than but close to the conduction band energy levels of the second doping region 124 and the third doping region 126, the first contact portion 142 may include the metal material having the high work function. The second contact portion 144 and the third contact portion 146 may include the metal material having the low work function.

Referring back to FIG. 1, the gate structure 150 adjacent to the source/drain region 120 may extend from the source/drain region 120 into the drift layer 110 to control the conductive path in the semiconductor device 10. In some embodiments, the gate structure 150 may include the gate electrode layer 154 and the gate dielectric layer 152. The gate electrode layer 154 may include a conductive material extending from the source/drain region 120 into the drift layer 110 to control the conductive path in the semiconductor device 10. For example, the gate electrode layer 154 may include polysilicon, metal nitride, metal silicide, metal oxide, metal, alloy, combinations thereof, or the like.

The gate dielectric layer 152 surrounds the gate electrode layer 154 to isolate the gate electrode layer 154 from the semiconductor material stack. As shown in FIG. 1, the gate dielectric layer 152 may cover the sidewalls and the bottom surface of the gate electrode layer 154 to separate the gate electrode layer 154 from the source/drain region 120 and separate the gate electrode layer 154 from the drift layer 110. The gate dielectric layer 152 may further cover the top surface of the gate electrode layer 154 to protect the gate electrode layer 154. The gate dielectric layer 152 may include, for example, oxides such as silicon oxide, nitrides such as silicon nitride, composite structure such as oxide/nitride/oxide (ONO), multilayers thereof, combinations thereof, or the like.

In some embodiments, the gate dielectric layer 152 may extend onto the source/drain region 120 to directly contact a portion of the top surface of the source/drain region 120. The extended portion of the gate dielectric layer 152 is between the gate electrode layer 154 and the contact 140, thereby isolating the gate electrode layer 154 from the contact 140 to prevent short circuit. Since the gate dielectric layer 152 extends onto the top surface of the source/drain region 120, the gate dielectric layer 152 may be adjacent to the oxide thin film 130 on the source/drain region 120. In some embodiments as shown in FIG. 1, the oxide thin film 130 and the gate dielectric layer 152 may be laterally separated by a distance, so that the oxide thin film 130 does not contact the gate dielectric layer 152. In some other embodiments, the gate dielectric layer 152 may extend to the sidewall of the oxide thin film 130 to directly contact the oxide thin film 130.

According to some embodiments of the present disclosure, FIGS. 8A to 8E illustrate cross-sectional views of various intermediate stages of forming the semiconductor device. The manufacturing process for forming the semiconductor device 10 is taken as an example in the following description for illustrating the steps shown in FIGS. 8A to 8E. However, those skilled in the art should understand that, the method illustrated in FIGS. 8A to 8E can be used for forming the semiconductor device 10 and other semiconductor device with the oxide thin film between the contact and the source/drain region within the scope of the present disclosure.

It should be noted that, unless otherwise stated, when FIGS. 8A to 8E show or illustrate a series of steps of the embodiments, the description sequence of these steps should not be limited. For example, some steps may be taken in a different order than the described embodiments, some steps may occur simultaneously, some steps may not be required, and/or some steps may be repeated. In addition, additional steps may be performed before, during, or after the illustrated steps to completely form the semiconductor device.

Figure 8A:
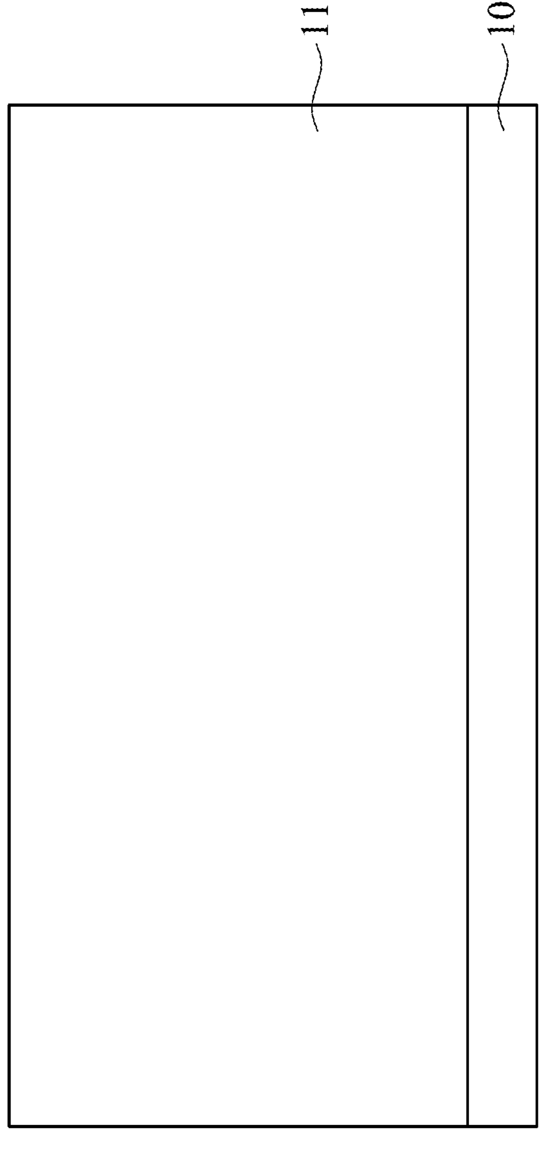
FIGS. 8A to 8E illustrate cross-sectional views of various intermediate stages of forming a semiconductor device according to one embodiment of the present disclosure.

Referring to FIG. 8A, the method starts from forming the drift layer 110 above the substrate 100. Specifically, a suitable semiconductor material is epitaxially grown on the substrate 100 to form the drift layer 110, in which the drift layer 110 may include the n-type dopant or the p-type dopant. For example, the epitaxial growth of the drift layer 110 on the substrate 100 may be performed by physical vapor transport (PVT), where the semiconductor material of the drift layer 110 is heated to gas phase and transported to the substrate 100 having relative low temperature. The above-mentioned process of forming the drift layer 110 is merely an example, and the drift layer 110 of the present disclosure may be formed by other deposition process or suitable techniques.

Figure 8B:
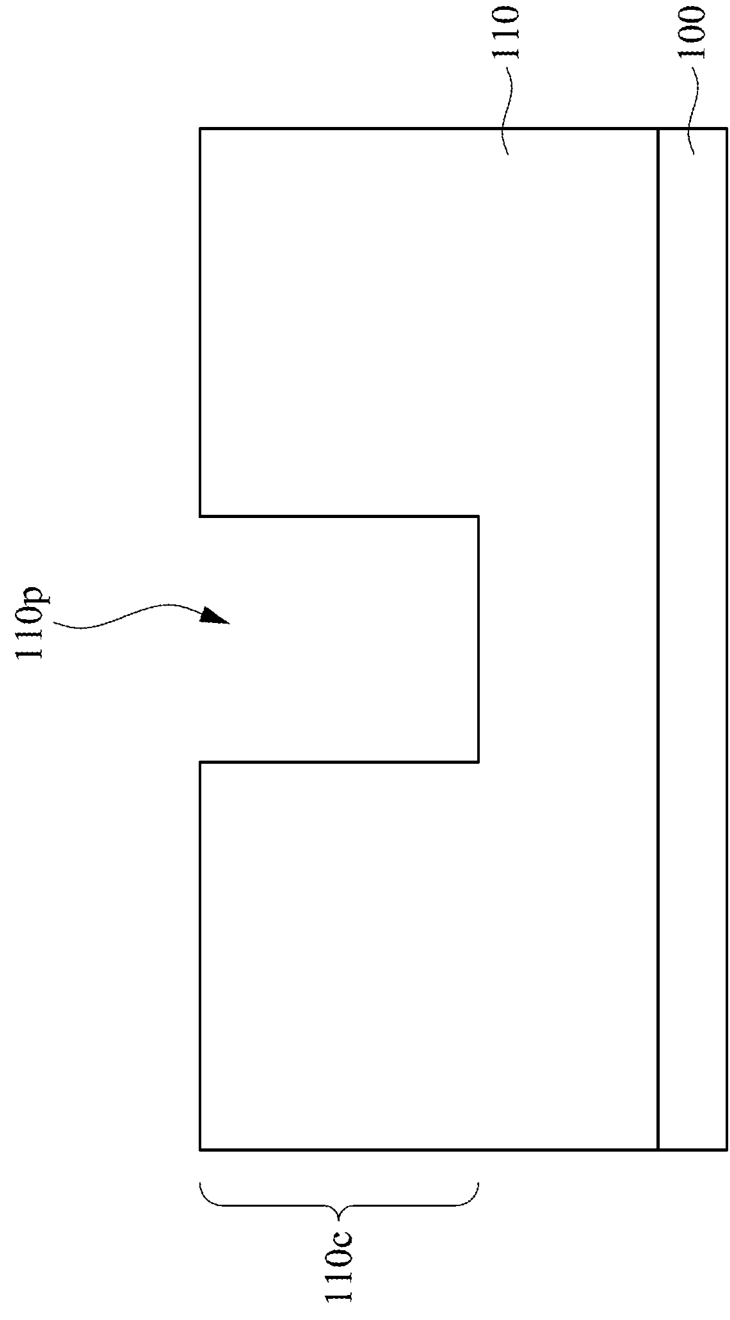

Referring to FIG. 8B, the method proceeds to forming an opening 110*p* in the drift layer 110 and a protruding portion 110*c* along the opening 110*p*. Specifically, an anisotropic etching process is performed on the top surface of the drift layer 110 to recess a portion of the top surface of the drift layer 110 and form the opening 110*p*. For example, the etching process may be a dry etching process using plasma or the like. In the following process, the opening 110*p* may have a suitable depth to act as the space for the gate structure (for example, the gate structure 150 shown in FIG. 8E). For example, the depth of the opening 110*p* may not be able to penetrate the drift layer 110, so that the opening 110*p* does not expose the substrate 100 below the drift layer 110.

Figure 8C:
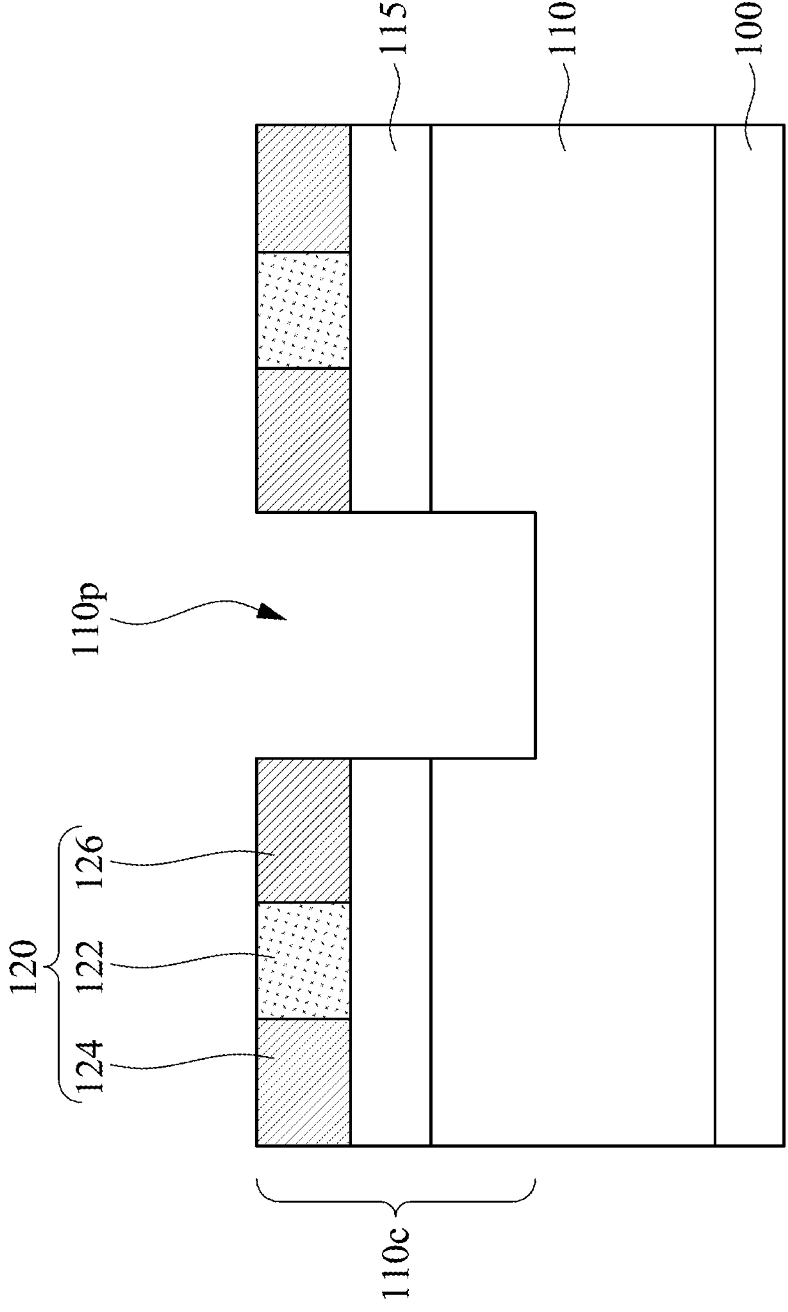

Referring to FIG. 8C, the method proceeds to doping the top surface of the drift layer 110 with a first conductive type dopant, thereby forming the first doping region 122 of the source/drain region 120. The top surface of the drift layer 110 is also doped with a second conductive type dopant to form the second doping region 124 and the third doping region 126 of the source/drain region 120. Specifically, the protruding portion 110*c* of the drift layer 110 is doped with the dopants to form the source/drain region 120. Before the doping process, the drift layer 110 in the opening 110*p* may first be protected by a mask layer (not shown in figures) to selectively form the source/drain region 120 in the protruding portion 110*c* and remain the drift layer 110 at the bottom portion of the opening 110*p*.

The first conductive type dopant for the doping region is different from the second conductive type dopant to form the first doping region 122 as a p-type doping region, while the second doping region 124 and the third doping region 126 are n-type doping regions, vice versa. In some embodiments, the position of the protruding portion 110*c* for the second doping region 124 and the third doping region 126 may first be protected by a first mask layer (not shown in figures) before the doping process using the first conductive type dopant, so that the drift layer 110 exposed by the first mask layer becomes the first doping region 122. Then, the first doping region 122 is protected by a second mask layer (not shown in figures) before the doping process using the second conductive type dopant, so that the drift layer 110 exposed by the second mask layer becomes the second doping region 124 and the third doping region 126. In some other embodiments, the first doping region 122, the second doping region 124, and the third doping region 126 may be formed in the sequence different from the above-mentioned manner.

In some embodiments, the protruding portion 110*c* of the drift layer 110 may first be doped to form the well 115 before the source/drain region 120 is formed. Then, the protruding portion 110*c* of the drift layer 110 is doped to form the source/drain region 120 above the well 115 to sandwich the well 115 between the drift layer 110 and the source/drain region 120. The conductive type of the well 115 may be different from that of the drift layer 110, and the conductive type of the well 115 may be same as that of some doping regions of the source/drain region 120.

In some embodiments, the doping concentration of the source/drain region 120 may be higher than that of the drift layer 110. In other words, the doping concentrations of the first doping region 122, the second doping region 124, and the third doping region 126 are higher than the doping concentration of the drift layer 110. The first doping region 122, the second doping region 124, and the third doping region 126 may have a same doping concentration or different doping concentrations. For example, the doping concentration of each doping region of the source/drain region 120 may be between $5\times10^{18}/cm^3$ and $5\times 10^{20}/cm^3$. If the doping concentration of the source/drain region 120 is lower than $5\times10^{18}/cm^3$, the contact resistance between the source/drain region 120 and the contact 140 may be so high that it significantly affects the overall ON resistance of the semiconductor device 10, even if the oxide thin film 130 is disposed between the source/drain region 120 and the later formed contact 140. In some embodiments, the doping concentration of the source/drain region 120 may also be higher than that of the well 115.

Figure 8D:
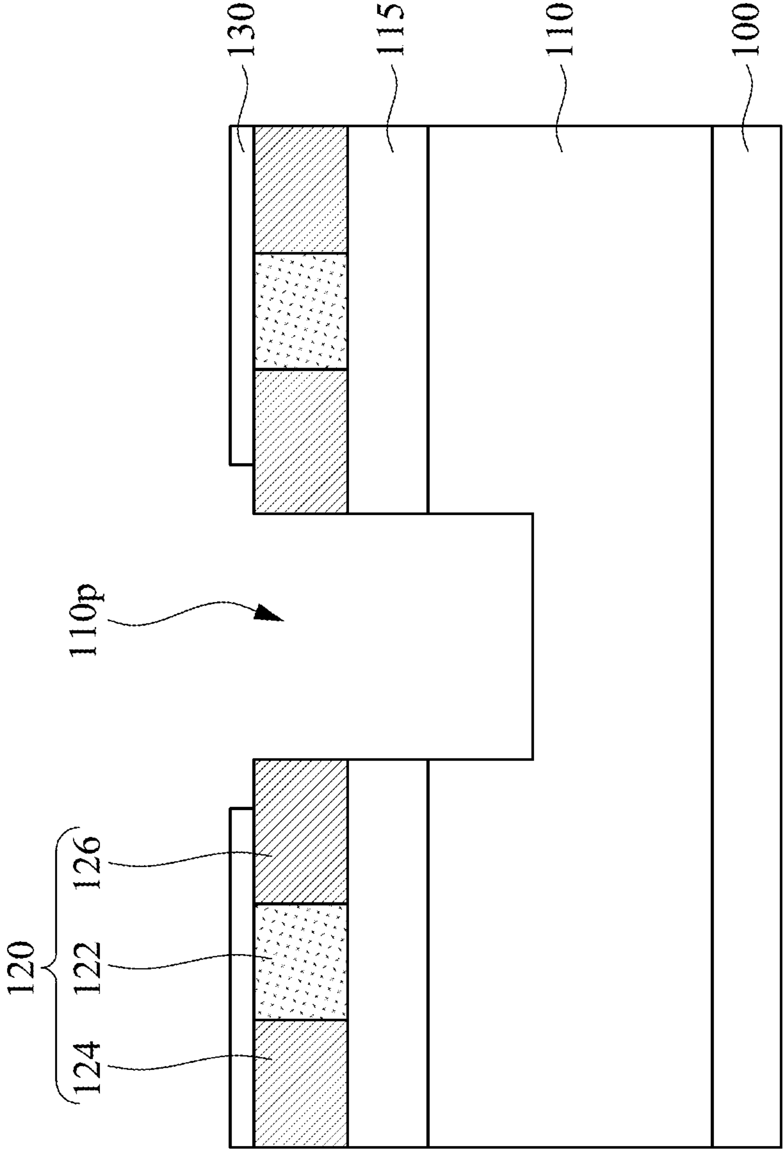

Referring to FIG. 8D, the method proceeds to forming the oxide thin film 130 on the source/drain region 120. Specifically, the oxide thin film 130 is directly formed on the top surface of the source/drain region 120, so that the bottom surface of the oxide thin film 130 directly contacts the top surface of the source/drain region 120. For example, the oxide thin film 130 may be formed by chemical vapor deposition (CVD), physical vapor deposition (PVD), atomic layer deposition (ALD), other suitable deposition process, or combinations thereof.

The material used in the deposition process is selected to make the conduction band energy level of the oxide thin film 130 lower than the conduction band energy level of the source/drain region 120. For example, in the embodiments which the oxide thin film 130 covers the first doping region 122 and the second doping region 124, the conduction band energy level of the oxide thin film 130 is lower than the conduction band energy level of the first doping region 122 or the second doping region 124. In the embodiments which the oxide thin film 130 covers the first doping region 122 and exposes the second doping region 124, the conduction band energy level of the oxide thin film 130 is lower than the conduction band energy level of the first doping region 122 but is not required to be lower than the conduction band energy level of the second doping region 124.

Figure 8E:
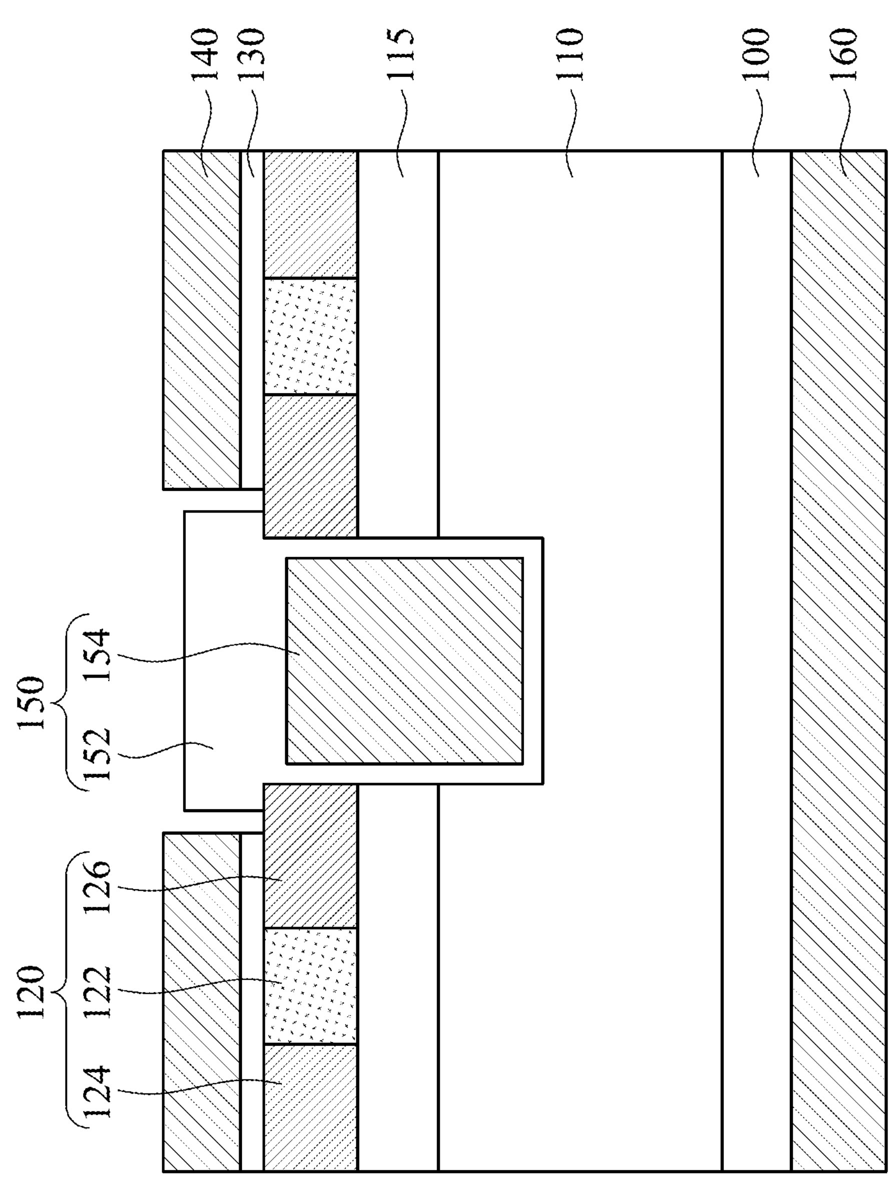

Referring to FIG. 8E, the method proceeds to forming the contact 140 on the oxide thin film 130. Specifically, the contact 140 is directly formed on the top surface of the oxide thin film 130, so that the bottom surface of the contact 140 directly contacts the top surface of the oxide thin film 130. For example, the contact 140 may be formed by evaporation, sputtering, plating, other suitable method, or combinations thereof. As shown in FIG. 8E, the bottom surface of the contact 140 may be overlapped with the entire top surface of the oxide thin film 130, so that the sidewall of the contact 140 is coplanar with that of the oxide thin film 130. In some other embodiments, the bottom surface of the contact 140 may be larger than the top surface of the oxide thin film 130, where the contact 140 extends beyond the oxide thin film 130 and contacts the source/drain region 120 not covered by the oxide thin film 130.

After forming the contact 140, the conductive path from the contact 140 to the substrate 100 would pass through the oxide thin film 130, the source/drain region 120, the well 115, and the drift layer 110. In some embodiments, the method may further include forming the contact 160 below the substrate 100, so the conductive path sequentially passes the contact 140, the oxide thin film 130, the source/drain region 120, the well 115, the drift layer 110, the substrate 100, and the contact 160.

In some embodiments, the method may further include depositing the gate dielectric layer 152 in the opening 110*p* shown in FIG. 8D and forming the gate electrode layer 154 in the gate dielectric layer 152 to form the gate structure 150 filling the opening 110*p*. The sequence of the steps for forming the gate structure 150, the contact 140, and the contact 160 may be rearranged according to the process requirement in other embodiments.

According to the above-mentioned embodiments of the present disclosure, the semiconductor device includes the oxide thin film between the source/drain region and the contact, in which the oxide thin film directly contacts the source/drain region and the contact. The conduction band energy level of the oxide thin film is lower than the conduction band energy level of the doping region in the source/drain region. As a result, the energy level difference between the oxide thin film and the doping region changes the energy level of the doping region, which improves the tunneling effect between the doping region and the contact. Therefore, the oxide thin film may reduce the contact resistance between the source/drain region and the contact, leading to the reduced ON resistance and improved performance of the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a drift layer above a substrate;
a source/drain region above the drift layer, wherein the source/drain region comprises:
a first doping region having a p conductive type; and
a second doping region having an n conductive type, wherein the first doping region and the second doping region form a top surface of the source/drain region;
an oxide thin film directly contacting the top surface of the source/drain region, wherein the oxide thin film comprises:
a first film portion covering the first doping region, wherein a conduction band energy level of the first film portion is lower than a conduction band energy level and a valance band energy level of the first doping region, and an energy gap between the conduction band energy level of the first film portion and the valance band energy level of the first doping region is larger than or equal to 0.1 eV; and
a second film portion covering the second doping region, wherein an energy gap between the conduction band energy level of the second film portion and the conduction band energy level of the second doping region is smaller than or equal to 0.1 eV;
a contact on the oxide thin film, wherein the oxide thin film directly contacts a bottom surface of the contact; and
a gate structure adjacent to the source/drain region.

2. The semiconductor device of claim 1, wherein a thickness of the oxide thin film is between 1 nm and 5 nm.

3. The semiconductor device of claim 1, wherein the oxide thin film comprises $MoO_3$, $WO_3$, or $V_2O_5$.

4. The semiconductor device of claim 1, wherein the contact comprises a metal material having a work function between 4.6 eV and 7.0 eV.

5. The semiconductor device of claim 1, wherein the oxide thin film covers the first doping region and the second doping region, and the contact covers the oxide thin film.

6. The semiconductor device of claim 1, wherein the oxide thin film covers the first doping region, the contact covers the oxide thin film and the second doping region.

7. The semiconductor device of claim 1, wherein the source/drain region further comprises:
a third doping region having the n conductive type, wherein the first doping region is sandwiched between the second doping region and the third doping region, and the first doping region, the second doping region, and the third doping region form the top surface of the source/drain region.

8. The semiconductor device of claim 7, wherein the oxide thin film comprises a first film portion covering the first doping region, a second film portion covering the second doping region, and a third film portion covering the third doping region, and a material of the first film portion is different from that of the second film portion and the third film portion.

9. The semiconductor device of claim 1, wherein the gate structure comprises:
a gate electrode layer, extending from the source/drain region into the drift layer; and a gate dielectric layer surrounding the gate electrode layer, wherein the gate dielectric layer isolates the gate electrode layer from the source/drain region and isolates the gate electrode layer from the drift layer.

10. The semiconductor device of claim 9, wherein the gate dielectric layer extends onto the source/drain region, and wherein the gate dielectric layer directly contacts the top surface of the source/drain region.

11. The semiconductor device of claim 9, wherein the oxide thin film and the gate dielectric layer are laterally spaced by a distance.

12. The semiconductor device of claim 9, wherein the oxide thin film directly contacts the gate dielectric layer.

13. A method of forming a semiconductor device, comprising:

forming a drift layer above a substrate;

doping a top surface of the drift layer with a p conductive type dopant to form a first doping region of a source/drain region;

doping the top surface of the drift layer with a n conductive type dopant to form a second doping region of the source/drain region;

forming an oxide thin film on the source/drain region, wherein the oxide thin film directly contacts a top surface of the source/drain region, and the oxide thin film comprises:

a first film portion covering the first doping region, wherein a conduction band energy level of the first film portion is lower than a conduction band energy level and a valance band energy level of the first doping region, and an energy gap between the conduction band energy level of the first film portion and the valance band energy level of the first doping region is larger than or equal to 0.1 eV; and a second film portion covering the second doping region, wherein an energy gap between the conduction band energy level of the second film portion and the conduction band energy level of the second doping region is smaller than or equal to 0.1 eV; and forming a contact on the oxide thin film, wherein a bottom surface of the contact directly contacts the oxide thin film.

14. The method of forming the semiconductor device of claim 13, wherein the drift layer is doped with the p conductive type dopant to a doping concentration between $5\times10^{18}/cm^3$ and $5\times10^{20}/cm^3$.

15. The method of forming the semiconductor device of claim 13, further comprising:

forming an opening in the drift layer and a protruding portion along the opening before doping the top surface of the drift layer;

doping the protruding portion of the drift layer with the p conductive type dopant and the n conductive type dopant to form the source/drain region; and forming a gate structure in the opening after doping the top surface of the drift layer, wherein the gate structure extends from the source/drain region into the drift layer.

* * * * *